United States Patent [19]

Klein

[11] 4,193,183
[45] Mar. 18, 1980

[54] INFRARED PHOTOLITHOGRAPHIC PROCESS FOR CONSTRUCTING SELF-ALIGNED ELECTRODES

[75] Inventor: Thomas Klein, Saratoga, Calif.

[73] Assignee: National Semiconductor Corporation, Santa Clara, Calif.

[21] Appl. No.: 919,157

[22] Filed: Jun. 26, 1978

[51] Int. Cl.² .............................................. B01J 17/00
[52] U.S. Cl. ....................................... 29/578; 29/590;
427/56.1; 156/653
[58] Field of Search ................. 29/578, 571, 590, 591;
96/36.2; 427/56

[56] References Cited
U.S. PATENT DOCUMENTS

| | | | |
|---|---|---|---|
| 3,542,550 | 11/1970 | Conrad | 29/578 |
| 3,558,881 | 1/1971 | Gold | 427/56 |
| 4,042,391 | 8/1977 | Fukutani | 427/56 |

Primary Examiner—W. C. Tupman
Attorney, Agent, or Firm—Brown & Martin

[57] ABSTRACT

A process for constructing self-aligned electrodes overlying a surface of a semiconductor substrate is disclosed. The process utilizes a substrate which is substantially transparent to infrared radiation. One step of the process includes forming spaced apart ones of the electrodes with a conductive material that is highly absorbtive of infrared radiation. Subsequently, a continuous layer of heat sensitive polymer is formed over and between these spaced apart electrodes. The resulting structure is exposed to infrared radiation which heats the spaced apart electrodes. This heat polymerizes the heat sensitive polymer layer in all regions that directly overlie the spaced apart electrodes. These polymerized regions form a mask that is used to construct other electrodes between and in alignment with the spaced apart electrodes.

15 Claims, 10 Drawing Figures

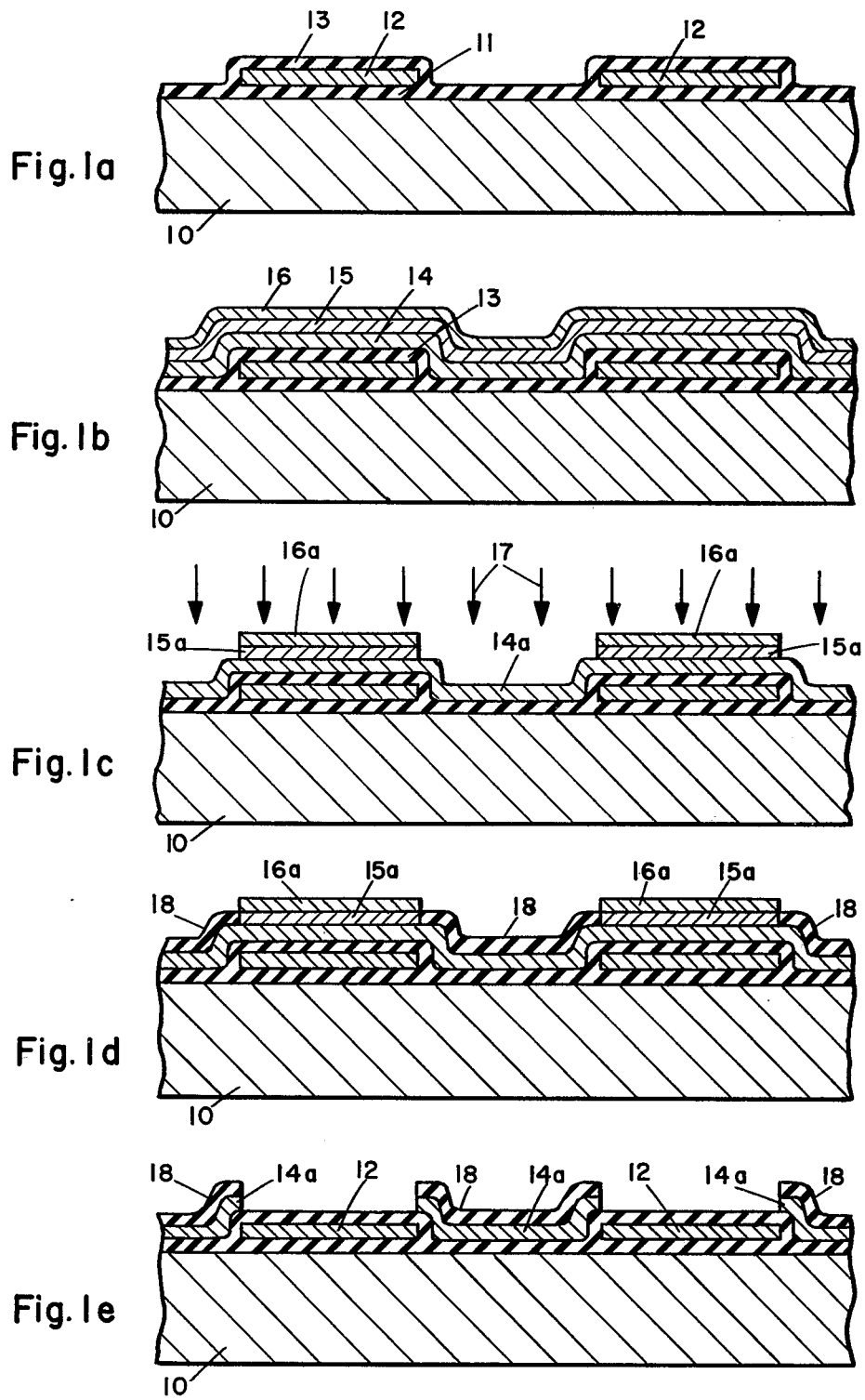

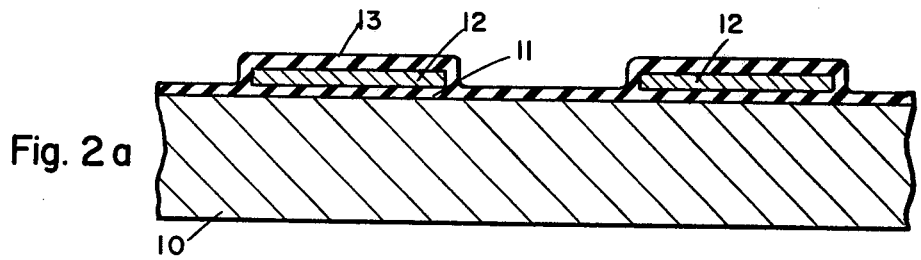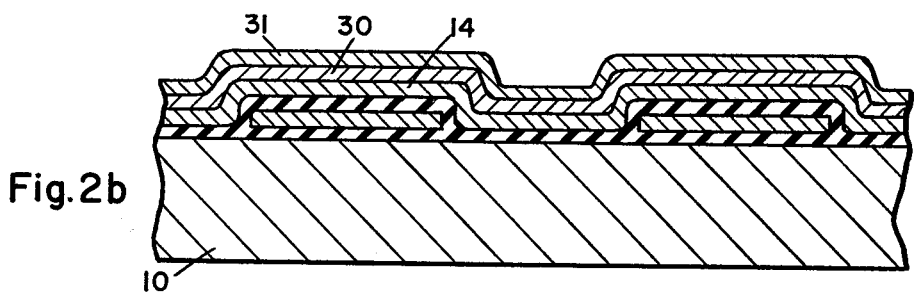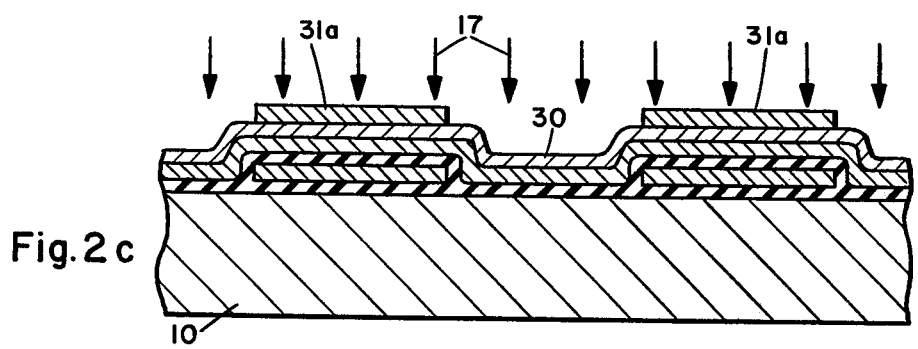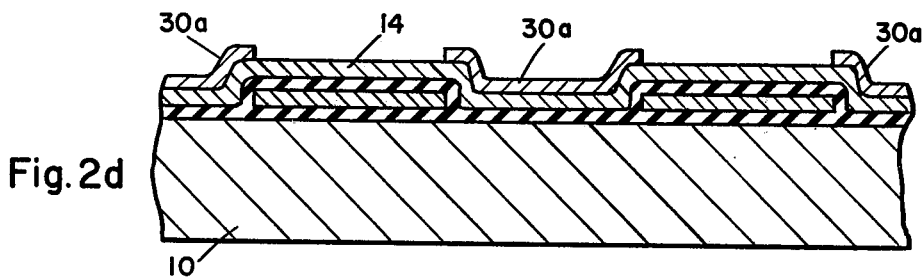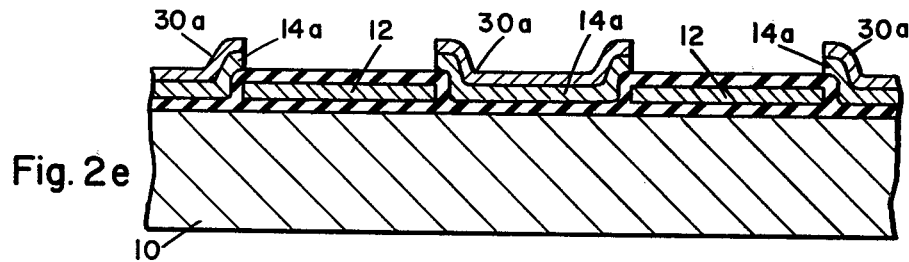

INFRARED PHOTOLITHOGRAPHIC PROCESS FOR CONSTRUCTING SELF-ALIGNED ELECTRODES

BACKGROUND OF THE INVENTION

This invention relates to methods for constructing a semiconductor device; and more particularly to methods for fabricating self-aligned electrodes on a semiconductor substrate as a portion of such a device. A variety of semiconductor devices require self-aligned electrodes as a portion of their overall structure. For example, charge coupled devices are comprised of hundreds of electrodes lying traversely to a charge transfer channel that is formed in a semiconductor substrate. Clocking signals are applied to the electrodes to form potential wells in the channel directly under the electrodes. These potential wells are utilized to propagate charge packets from one end of the channel to another. As another example, self-aligned electrodes comprise a portion of the storage cells within MOS random access memories. Typically within each cell, one electrode forms one plate of storage capacitor while a second electrode lies adjacent to the one electrode to form a gate between the storage capacitor and a bit line. Charge is transferred from the storage capacitor to the bit line by applying appropriate clocking signals to the gate electrode.

Over the last several years, the trend in the semiconductor industry has been to make these and other adjacent electrodes as small as possible. This for example, allows the charge coupled device to have more stages per chip; and allows the random access memory to have storage cells per chip. Typically, such electrodes have a minimum width of approximately 8 microns.

As the width of the electrodes is made small however, the task of aligning the electrodes with each other becomes more difficult. This is because the dimensions of the masks which are used to form the electrodes can only be controlled within certain tolerances; and because the masks that are used can also only be aligned with each other within certain tolerances. Typically, to overcome these tolerance problems, alternate ones of the electrodes are fabricated such that they slightly overlap the other electrodes. For example, an electrode having a width of 8 microns is typically overlapped on either side by 2 microns of the adjacent electrode. Such an overlap is necessary in order to avoid gaps between adjacent electrodes. These gaps would form potential barriers in the underlying substrate region which in turn would adversely affect the device's operation.

Unfortunately however, the overlap of the adjacent electrodes also produces an adverse effect. In particular, the overlap gives rise to an interelectrode capacitance. Typically, this capacitance is on the order of several thousand picofarads. As a result of this capacitance, the device's operation is slowed. That is, the rise and fall time of signals applied to the electrodes is limited in proportion to the amount of interelectrode's capacitance. Also, this interelectrode capacitance has the effect of increasing the power which the device dissipates. Specifically, the energy stored in the interelectrode capacitance is $\frac{1}{2}CV^2$ where C is the interelectrode capacitance and V is the voltage across the capacitance. This energy is dissipated and turned into heat each time the clocking signals applied to the electrodes switch from a high voltage level to a low voltage level. And this heat may adversely affect the operation of the device.

Accordingly, it is one object of the invention to provide an improved method of fabricating adjacent electrodes in a semiconductor device.

Another object of the invention is to provide a self-aligning method of fabricating adjacent electrodes on a semiconductor device.

Still another object of the invention is to provide a method of fabricating self-aligned electrodes on a semiconductor device by use of infrared photolithography.

SUMMARY OF THE INVENTION

These and other objects are accomplished in accordance with the invention by a process which uses a semiconductor substrate having dopant impurity atoms of a first density. An insulating layer is formed on the substrate. Spaced apart polysilicon electrodes, having dopant impurity atoms of a second density which is substantially greater than the first density, are formed on the insulating layer. Another insulating layer is formed over the spaced apart polysilicon electrodes. Subsequently, a layer of polysilicon, having dopant impurity atoms of a third density which is substantially less than the second density, is formed thereon. A layer of image reversing material is formed on the polysilicon layer; and a layer of heat sensitive polymer is formed on the image reversal layer. The image reversal layer is comprised of any material which will prevent oxidizing of the underlying polysilicon layer and can be removed by a selective etchant. Similarly, the heat sensitive polymer layer may be comprised of any material which polymerizes when subjected to heat. Then, the entire structure is exposed to infrared radiation. The lightly doped semiconductor substrate and lightly doped polysilicon layer are essentially transparent to this radiation, whereas the heavily doped spaced apart electrodes absorb the radiation. As a result, the spaced apart electrodes heat up. This heat polymerizes the heat sensitive polymer in regions lying directly above the electrodes. Subsequently, the unpolymerized portions of the heat sensitive polymer layer and the underlying portions of the image reversal layer are removed to expose those portions of the polysilicon layer lying between the spaced apart electrodes. An insulating layer is formed on these exposed portions, and those regions of polysilicon layer not covered by this insulating layer are removed.

DESCRIPTION OF THE DRAWINGS

The novel features believed characteristic of the invention are set forth in the appended claims; the invention itself however, as well as other features and advantages thereof, will best be understood by reference to the following detailed description of particular embodiments when read in conjunction with the accompanying drawings wherein:

FIGS. 1a–1e are a plurality of greatly enlarged cross sectional views illustrating a charge coupled device at various stages in a fabrication process according to the invention.

FIGS. 2a–2e are a plurality of greatly enlarged cross sectional views illustrating a charge coupled device at various stages in another fabrication process according to the invention.

DETAILED DESCRIPTION

A process for constructing self-aligned electrodes according to the invention will now be described in conjunction with FIGS. 1a–1e. FIGS. 1a–1e contain a plurality of greatly enlarged cross sectional views which illustrate a charge coupled device at various stages in its fabrication process. The cross section is taken along the charge transfer channel of the device.

At the stage illustrated in FIG. 1A, the charge coupled device includes a semiconductor substrate 10, an insulating layer 11 lying on a first surface of substrate 10, a plurality of spaced apart electrodes 12 lying on insulating layer 11, and an insulating layer 13 covering electrodes 12. Suitably, substrate 10 is comprised of silicon. Included within the substrate are dopant impurity atoms which may be either P type or N type. Electrodes 12 are composed of polysilicon. They also include dopant impurity atoms which make the polysilicon conductive.

In accordance with the invention, the dopant impurity charge density in substrate 10 is relatively light in comparison to the dopant impurity charge density of electrodes 12. The purpose for this constraint is based on the observation that lightly doped silicon and polysilicon is relatively transparent to infrared radiation, whereas heavily doped silicon and polysilicon is highly absorbative of infrared radiation. This phenomenon is used in the disclosed process to form a self-aligned mask by heating a heat sensitive polymer layer as described infra.

A wide range of relative dopant densities may suitably be used to achieve the desired heating effects. Preferably, however, the dopant density of electrodes 13 differs from that of substrate 10 by a factor of approximately a thousand. For example, the dopant density of substrate 10 may be less than $5 \times 10^{16}$ atoms/cm$^3$; while the dopant density of electrodes 12 may be greater than $5 \times 10^{19}$ atoms/cm$^3$.

A subsequent stage of the process is illustrated in FIG. 1B. As therein illustrated, a layer of polysilicon 14 is formed on insulating layer 13. Polysilicon layer 14 also has dopant impurity atoms of a relatively light density. Preferably, this density is also approximately 1000 times less than the density of the dopant atoms in electrodes 12. Thus, it may suitably lie in the range of less than $5 \times 10^{16}$ atoms/cm$^3$.

A layer of image reversing materials is disposed on layer 14; and a layer of heat sensitive polymer 16 is disposed on layer 15. The image reversal material of layer 15 may be comprised of any material which will prevent oxidizing of the underlying polysilicon layer 14 and can be removed by a selective etchant which will not attack silicon dioxide. Suitably, layer 15 is comprised of silicon nitride ($Si_3N_4$), or Phosphorus doped silicon dioxide. Similarly, the heat sensitive polymer layer 16 may be comprised of any material which polymerizes when subjected to heat. A photo resist such as Kodak Microneg "747" or any other commonly used negative resist may be used for example.

Each of the components 11–16 may have a variety of dimensions depending upon the particular device being constructed. Typically in a charge coupled device insulating layer 11 is between (500–1000) Å thick; electrodes 12 and the spacing therebetween are approximately 4–6 microns wide; electrodes 12 are approximately 3,000 Å thick; and insulating layer 13 is between (1000–3000) Å thick. For a device with these dimensions, an appropriate thickness for layers 14, 15 and 16 respectively is 3,000 Å, 5,000 Å–1,000 Å, and 5,000 Å–15,000 Å.

A subsequent stage of the process is illustrated in FIG. 1C. In this stage, the structure of FIG. 1B is exposed to infrared radiation 17. Due to their relatively light doping, polysilicon layer 14 and silicon substrate 10 are transparent to this radiation. Conversely, infrared radiation 17 is absorbed by electrodes 12 due to their relatively heavy doping. The absorbed radiation causes electrodes 12 to heat up. This in turn, selectively polymerizes the heat sensitive polymer in the regions lying directly above the electrodes. The polymerized portions of layer 16 are indicated at 16a.

Subsequently, the unpolymerized portions of layer 16 and the underlying portions of image reversal layer 15 are removed. Any one of several conventional techniques may be used to remove and unpolymerized portions of layers 15 and 16. This exposes the portions of polysilicon layer 14 which lie between electrodes 12. Reference numeral 14a indicates the portion of polysilicon layer 14 which is exposed by these steps.

Subsequently, an inculating layer 18 is grown on the exposed polysilicon 14a. This is illustrated in FIG. 1D. Suitably, layer 18 is formed of $SiO_2$ and is grown in an oxidation furnace. This oxidation layer grows in alignment with electrodes 12 since by definition it will not grow on image reversal layer 15a.

The remaining steps of the process involve the removal of patterned layers 16a and 15a, and the removal of that portion of polysilicon layer 14 which lies thereunder. These removal operations are performed by conventional selective etchants. For example, an image reversal layer of silicon nitride may be selectively etched with either phosphoric acid or a plasma; while an image reversal layer of phosphorous doped silicon dioxide may be selectively etched in dilute hydroflouric acid.

Similarly, polysilicon layer 14 may be selectively etched by any material which will not attack the patterned $SiO_2$ layer 18. By this etch, electrodes 14a are formed as illustrated in FIG. 1E. In accordance with the invention, the edges of electrodes 14a are in direct alignment with the underlying edges of electrodes 12. As a result, interelectrode capacitance is reduced to a minimum. At the same time, no gaps exist between the edges of electrodes 14a and electrodes 12 and thus no potential barriers exist in the channel region between the electrodes.

A second process for constructing self-aligned electrodes by a process according to the invention will now be described in conjunction with FIGS. 2 a–2e. FIGS. 2a–2e are a set of cross sectional views taken along the channel of a charge coupled device during various stages of its fabrication process. The end result of this process is the same device which was previously described in conjunction with FIGS. 1a–1e. Identical portions of the device of FIGS. 1a–1e and FIGS. 1a–1e are indicated by like reference numerals.

FIG. 2A illustrates an initial stage of the process. The device at this stage includes a semiconductor substrate 10 having an insulating layer 11 disposed on a surface thereof. Spaced apart electrodes 12 lie on insulating layer 11, and an insulating layer 13 overlies electrodes 12. Substrate 10 and electrodes 12 both include dopant impurity atoms, with the dopant density of substrate 10 being substantially less than the dopant density of electrodes 12. Accordingly, the device at this stage is the same as the device previously described in conjunction with FIG. 1A.

A layer of polysilicon 14 is subsequently formed on insulating layer 13. This is illustrated in FIG. 2B. Polysilicon layer 14 also has dopant impurity atoms of a density which is substantially less than the dopant density of electrodes 12. An insulating layer 30 is formed on polysilicon layer 14; and a layer of heat sensitive polymer 31 is disposed on layer 30. Suitably, layer 30 is comprised of silicon dioxide and is approximately (1000–3000) Å thick. Also suitably, layer 31 is comprised of a photo resist and is approximately (5,000–15,000) Å thick.

Subsequently, the structure of FIG. 2B is exposed to infrared radiation 17 as illustrated in FIG. 2C. This radiation is absorbed by electrodes 12 as previously described in conjunction with FIGS. 1a–1e. As a result, electrodes 12 heat up, which in turn polymerizes layer 31 in the regions lying directly above electrodes 12. These polymerized regions are indicated by reference numeral 31a. The unpolymerized portions of layer 31 are then removed by conventional techniques; and the resulting structure is illustrated in FIG. 2C.

The structure of FIG. 2C is subsequently subjected to a "dri-ox" fabrication step. This step is described in detail in the publication entitled Solid State Technology, April 1977, pages 78–80. (The Dry Ox$^x$ Process For Etching Silicon Dioxide by R. L. Bersin and R. F. Reicheldeyer). Basically, the "dri-ox" step operates to remove those portions of insulating layer 30 which are covered by resist 31a. In operation, resist 31a supplied OH molecules which combine with the etchants used with the "dri-ox" step to provide localized etching. After this step of the process, only those portions of inculating layer 30 which are not covered by resist 31a remain. These portions are indicated by reference numerals 30a in FIG. 2D.

The structure of FIG. 2D is then exposed to a selective etchant which attacks polysilicon but does not substantially affect silicon dioxide. As a result, those portions of polysilicon layer 14 which lie between silicon dioxide layers 30a are removed. Those portions of layer 14 which remain form spaced apart electrodes 14a. These electrodes are self-aligned with the electrodes 12. This is illustrated in FIG. 2E.

Various process steps for constructing self-aligned electrodes on a semiconductor device have now been described in detail. In addition, many changes and modifications may be made to these detailed steps without departing from the nature and spirit of the invention. For example, while the structure of FIGS. 1a–1e and 2a–2e is a charge coupled device having a plurality of aligned electrodes, the process is equally applicable to the fabrication of any semiconductor device having at least two aligned electrodes. For example, a storage gate electrode and transfer gate electrode of a MOS RAM memory can be self-aligned by the disclosed process. Therefore since many changes and modifications can be made to the described details without departing from the spirit of the invention, it is to be understood that the invention is not limited to said details but is defined by the appended claims.

What I claim is:

1. A process for constructing self-aligned electrodes on an insulating layer lying on a surface of a semiconductor substrate having dopant impurity atoms of a first density comprised of the steps of:

forming on said insulating layer, spaced apart polysilicon electrodes having dopant impurity atoms of a second density which is substantially greater than said first density;

forming an insulating layer over said spaced apart polysilicon electrodes;

forming on said insulating layer over said electrodes, a layer of polysilicon having dopant impurity atoms of a third density which is substantially less than said second density;

forming a layer of image reversal material on said polysilicon layer;

forming a layer of heat sensitive polymer on said image reversal layer;

heating said spaced apart electrodes with infrared radiation to polymerize said heat sensitive polymer directly above said electrodes;

removing the unpolymerized portions of said heat sensitive polymer layer and the underlying portions of said image reversal layer to expose the portions of said polysilicon layer lying between said spaced apart electrodes;

forming an insulating layer on said exposed portions; and removing said polysilicon layer in the regions not covered by said insulating layer on said exposed portions.

2. A process according to claim 1, wherein said image reversal layer is $Si_3N_4$.

3. A process according to claim 1, wherein said image reversal layer is phosphorous doped $SiO_2$.

4. A process according to claim 1, wherein said heat sensitive polymer is a photoresist.

5. A process according to claim 1, wherein said insulating layers are $SiO_2$.

6. A process according to claim 1, wherein said second density is approximately $10^3$ times larger than said first and third densities.

7. A process according to claim 1, wherein said second density is approximately $10^{19}$ atoms/cm$^3$ or larger.

8. A process for constructing self-aligned electrodes on an insulating layer lying on a surface of a semiconductor substrate having dopant impurity atoms of a first density comprised of the steps of:

forming on said insulating layer, spaced apart polysilicon electrodes having dopant impurity atoms of a second density which is substantially greater than said first density;

forming an insulating layer over said spaced apart polysilicon electrodes;

forming on said insulating layer over said electrodes, a layer of polysilicon having dopant impurity atoms of a third density which is substantially less than said second density;

forming an insulating layer on said polysilicon layer;

forming a layer of heat sensitive polymer on said insulating layer lying on said polysilicon layer;

heating said spaced apart electrodes with infrared radiation to polymerize said heatt sensitive polymer directly above said electrodes;

removing said unpolymerized portions of said heat sensitive polymer layer;

removing said insulating layer under the polymerized portions of said polymer layer to expose the portions of said polysilicon layer lying directly above said electrodes; and removing said exposed portions of said polysilicon layer.

9. A process according to claim 8, wherein said image reversal layer is $Si_3N_4$.

10. A process according to claim 8, wherein said image reversal layer is phosphorous doped $SiO_2$.

11. A process according to claim 8, wherein said heat sensitive polymer is a photoresist.

12. A process according to claim 8, wherein said insulating layers are $SiO_2$.

13. A process according to claim 8, wherein said second density is approximately $10^3$ times larger than said first and third densities.

14. A process according to claim 8, wherein said second density is approximately $10^{19}$ atoms/$cm^3$ or larger.

15. A process for constructing self-aligned electrodes overlying a surface of a semiconductor substrate that is substantially transparent to infrared radiation including the steps of:

forming spaced apart ones of said electrodes with conductive means that is highly absorbative of infrared radiation;

forming a continuous layer of heat sensitive polymer means over and between said spaced apart electrodes for polymerizing in response to heat applied thereto; and exposing the resulting structure to infrared radiation to heat said spaced apart electrodes and thereby heat and polymerize said heat sensitive polymer means in the regions lying directly above said spaced apart electrodes.

* * * * *